(12) United States Patent
Lee

(10) Patent No.: US 11,917,787 B2
(45) Date of Patent: Feb. 27, 2024

(54) SERVER RACK

(71) Applicant: DOBE COMPUTING INC., Gyeonggi-do (KR)

(72) Inventor: Sung Kyun Lee, Gyeonggi-do (KR)

(73) Assignee: DOBE COMPUTING INC., Gyeonggi-Do (KR)

( * ) Notice: Subject to any disclaimer, the term of this patent is extended or adjusted under 35 U.S.C. 154(b) by 95 days.

(21) Appl. No.: 17/487,796

(22) Filed: Sep. 28, 2021

(65) Prior Publication Data

US 2023/0093262 A1 Mar. 23, 2023

(30) Foreign Application Priority Data

Sep. 23, 2021 (KR) .................. 10-2021-0125680

(51) Int. Cl.
*H05K 7/14* (2006.01)
*H04W 4/80* (2018.01)
*H05K 7/20* (2006.01)

(52) U.S. Cl.
CPC ............ *H05K 7/1494* (2013.01); *H04W 4/80* (2018.02); *H05K 7/20836* (2013.01)

(58) Field of Classification Search
CPC .................................................. H05K 7/1494
See application file for complete search history.

(56) References Cited

U.S. PATENT DOCUMENTS

| | | | | |
|---|---|---|---|---|
| 9,864,417 B2* | 1/2018 | Bermudez Rodriguez | | G06F 1/3206 |
| 10,198,538 B1* | 2/2019 | Quayle | ................ | G06F 30/331 |
| 11,051,613 B1* | 7/2021 | Gilbreath | ................ | E05B 65/46 |
| 2014/0320308 A1* | 10/2014 | Lewis | ...................... | H04Q 9/00 |
| | | | | 340/870.07 |
| 2016/0014073 A1* | 1/2016 | Reddy | ..................... | H04L 43/16 |
| | | | | 713/2 |
| 2017/0123449 A1* | 5/2017 | Ahmed | ...................... | G06F 1/16 |

(Continued)

FOREIGN PATENT DOCUMENTS

| KR | 1020000038878 | 7/2000 |
|---|---|---|
| KR | 10148874 | 12/2014 |

(Continued)

*Primary Examiner* — David Bilodeau

(74) *Attorney, Agent, or Firm* — IPLA P.A.

(57) ABSTRACT

A server rack includes: a rack cabinet equipped with a door; information processing devices installed inside the rack cabinet in accordance with rack mount specifications; collection devices configured to collect environmental status information inside the rack cabinet; a temperature control device configured to control environmental conditions inside the rack cabinet; a network device configured to establish a communication environment between the plurality of information processing devices; a microcomputer configured to exchange data with the information processing devices, to receive operating status information and environmental status information from the temperature control device and the collection devices, and to control the operations of the information processing devices and the temperature control device according to input information; and an input/output device configured to display content corresponding to the output information of the microcomputer, and to generate the input information according to the manipulation of an administrator.

4 Claims, 8 Drawing Sheets

(56) References Cited

U.S. PATENT DOCUMENTS

| | | | | |
|---|---|---|---|---|
| 2017/0134217 A1* | 5/2017 | Ahmed | ............ | H04L 41/044 |
| 2017/0134349 A1* | 5/2017 | Ahmed | ............ | H04W 12/10 |
| 2017/0322613 A1* | 11/2017 | Lin | ............ | G06F 1/3234 |
| 2017/0324636 A1* | 11/2017 | Wang | ............ | H05K 7/20836 |
| 2018/0295753 A1* | 10/2018 | Ackaret | ............ | H05K 7/20745 |

FOREIGN PATENT DOCUMENTS

| | | |
|---|---|---|
| KR | 1020160080690 | 7/2016 |
| KR | 1020190076402 | 7/2019 |
| KR | 1020200072369 | 6/2020 |

\* cited by examiner

SERVER RACK

CROSS-REFERENCE

This application claims the benefit of Korean Patent Application No. 10-2021-0125680 filed on Sep. 23, 2021, which is hereby incorporated by reference herein in its entirety.

BACKGROUND

The present invention relates to a server rack that allows information processing devices to be installed in accordance with rack mount specifications.

A server rack is a generic term for a device composed of shelves on which various information processing devices such as servers or hubs are placed. In general, a server rack is intended to allow information processing devices to operate while accommodating, mounting, and safely protecting the information processing devices in accordance with the requirements of the International Standard (IEC) by efficiently using the small space of a rack cabinet. A server rack is provided with a frame configured to install various types of information processing devices, such as servers and network equipment, in a rack cabinet in accordance with rack mount specifications.

A server rack is a method of stacking information processing devices such as servers or hubs in accordance with the general rack mount specifications of a server rack on respective layers in order to accommodate and install them. A server rack has an advantage in that devices having respective functions can be freely arranged according to a user's request.

However, the information processing devices installed in the server rack are terminals that perform independent tasks such as independent pieces of data processing, independent processes, and independent pieces of communication. Accordingly, in order to manage the information processing devices installed in the server rack, a server rack administrator (hereinafter referred to as the "administrator") needs to connect a device such as a notebook computer to a selected information processing device with a communication cable and then perform a task. In order to overcome this inconvenience, conventionally, multiple information processing devices are collectively connected to one KVM switch (keyboard, video, and mouse switch) on a per-server rack basis, so that an administrator can select a specific information processing device and perform a task simply by operating the KVM switch. However, this approach is problematic in that there is a load burden on the switching of communication for each target because the KVM switch performs direct connection rather than network connection with information processing devices, and is also problematic in that compatibility is low in response to a change in the number of information processing devices because a number of buttons for the selection of information processing devices equal to the number of information processing devices need to be provided in the KVM switch itself. Moreover, a limitation is imposed on the location of installation because a server installation space is required for the installation of the KVM switch.

Meanwhile, the information processing devices of the server rack generate heat due to high integration and high performance. If this heat load is not removed, it may lead to a fatal result such as a system stop, a system failure, or the like. Accordingly, a general cooling method for the server rack is designed to remove a heat load by constructing a separate computer room and blowing air, cooled through an air conditioning unit, into a rack cabinet. When such a computer room cannot be operated separately due to a problem such as an expensive management cost or an insufficient installation space, a temperature control device such as a heat exchanger is installed inside the rack cabinet to deal with a heat load. In addition, in order to prevent the frequent opening and closing of the door, a simple console having a simple input/output function equipped with a monitor is provided to detect environmental conditions inside the rack cabinet and the operating status of a temperature control device so that an administrator can check the results and control the temperature control device from the outside. A battery and an uninterruptible power supply (UPS) (hereinafter referred to as the "power supply device") used to supply power in order to drive the information processing devices and the temperature control device are installed in the server rack, and the console is connected to the power supply device, receives information such as power consumption and an operating status, and outputs the information through the monitor. Therefore, in addition to checking the information processing devices, the administrator is able to monitor, manage, and control a storage environment, such as the internal temperature of the rack cabinet and power consumption, in the state in which the door is closed.

However, the KVM switch for managing the information processing device and the console for managing the storage environment of the information processing devices each distribute numerous communication cables, thereby making it difficult for the administrator to manage the wiring. Furthermore, in order to select and check one of the plurality of information processing devices, the door needs to be opened, which is unreasonable in terms of management efficiency. Moreover, the installation of the KVM switch and the console occupies the space of the rack cabinet, so that the storage of information processing devices inside the rack cabinet is reduced.

Related art document 1: Korean Patent Application Publication No. 10-2000-0038878 (published on Jul. 5, 2000)

SUMMARY OF THE INVENTION

The present invention has been conceived to overcome the above-described problems, and an object of the present invention is to provide a server rack that enables an administrator to easily manage the operations of information processing devices and a storage environment inside a rack cabinet and can increase space utilization, thereby improving spatial and functional scalability.

In order to accomplish the above object, the present invention provides a server rack including:
  a rack cabinet equipped with a door;
  information processing devices installed inside the rack cabinet in accordance with rack mount specifications;
  collection devices configured to collect environmental status information inside the rack cabinet;
  a temperature control device configured to control environmental conditions inside the rack cabinet;
  a network device configured to establish a communication environment between the plurality of information processing devices;
  a microcomputer configured to be connected to the network device and exchange data with the information processing devices through communication, to receive operating status information and environmental status information from the temperature control device and the collection devices, and to control the operations of the information processing devices and the temperature control device according to input information; and an input/output device configured to display content corresponding to the output information of the microcomputer, and to generate the input information according to the manipulation of an administrator.

BRIEF DESCRIPTION OF THE DRAWINGS

The above and other objects, features, and advantages of the present invention will be more clearly understood from the following detailed description taken in conjunction with the accompanying drawings, in which.

DETAILED DESCRIPTION OF THE INVENTION

Although general terms that are most widely used currently have been selected as terms used in the following embodiments while taking into consideration the functions of corresponding components in the present invention, they may vary depending on an intention of those of ordinary skill in the art, judicial precedents, the emergence of new technology, and/or the like. In addition, in specific cases, terms have been selected by the present applicant as desired, in which cases the meanings of the terms will be described in detail in the corresponding portions of the description of the embodiments. Accordingly, the terms used herein should be defined not by the simple names of the terms but by the meanings thereof and the context thereof throughout the present specification.

Throughout the overall specification, when a part is described as "including" a component, it means that the part may include another component rather than excluding another component, unless otherwise stated. Furthermore, terms such as " . . . unit" and " . . . module" each refer to a unit within which at least one function or operation is processed. This may be implemented as hardware, software, or a combination of hardware and software.

In the following description, embodiments of the present invention will be described in detail with reference to the accompanying drawings so that those of ordinary skill in the art to which the present invention pertains can easily implement them. However, the present invention may be embodied in various different forms and is not limited to the embodiments described herein.

The present invention will be described in detail below with reference to the accompanying drawings.

Figure 1:
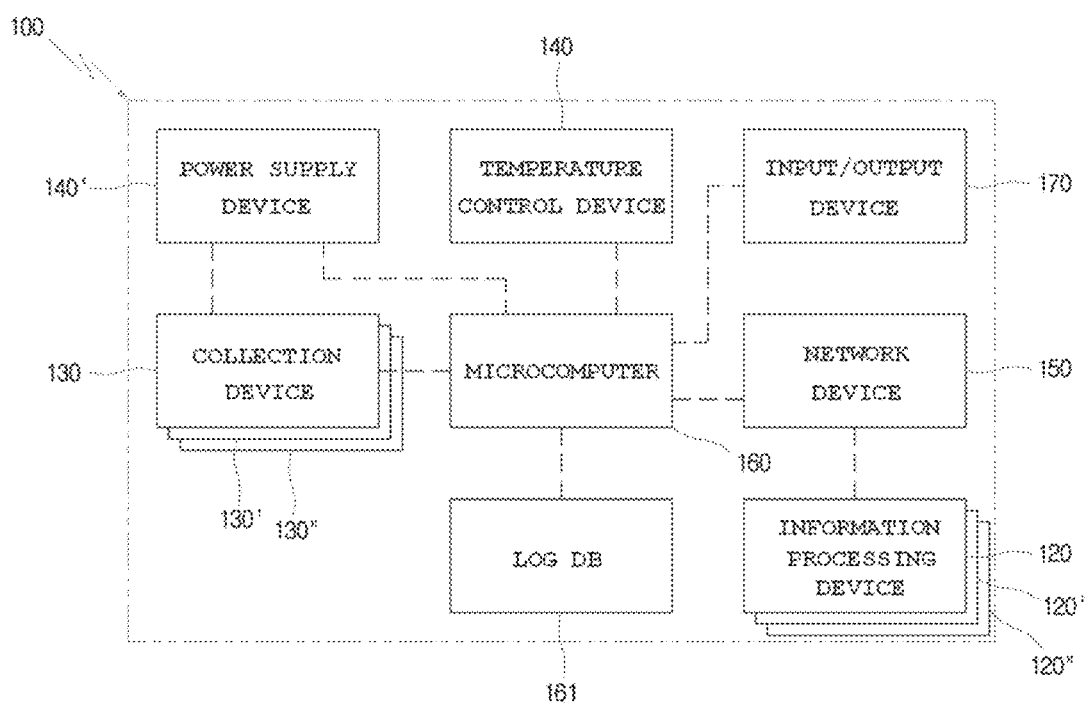
FIG. 1 is a block diagram showing an embodiment of the component devices of a server rack according to the present invention.
Figure 2:
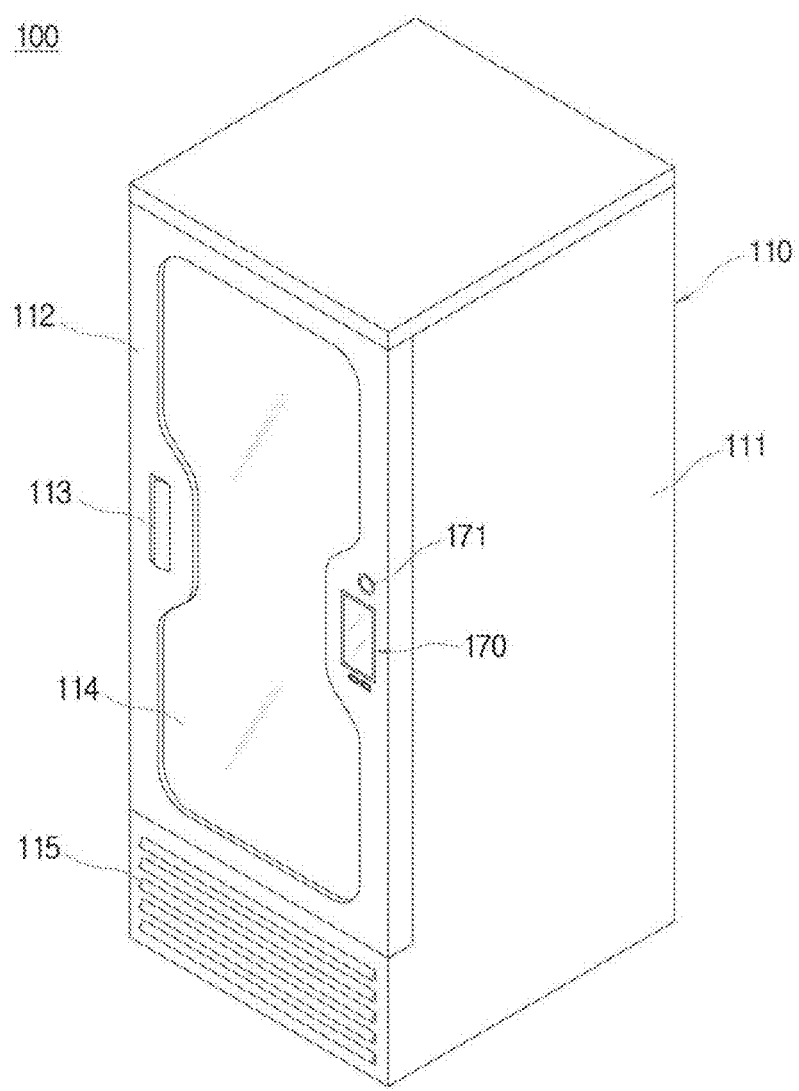
FIG. 2 is a perspective view schematically showing the external appearance of the server rack according to the present invention.
Figure 3:
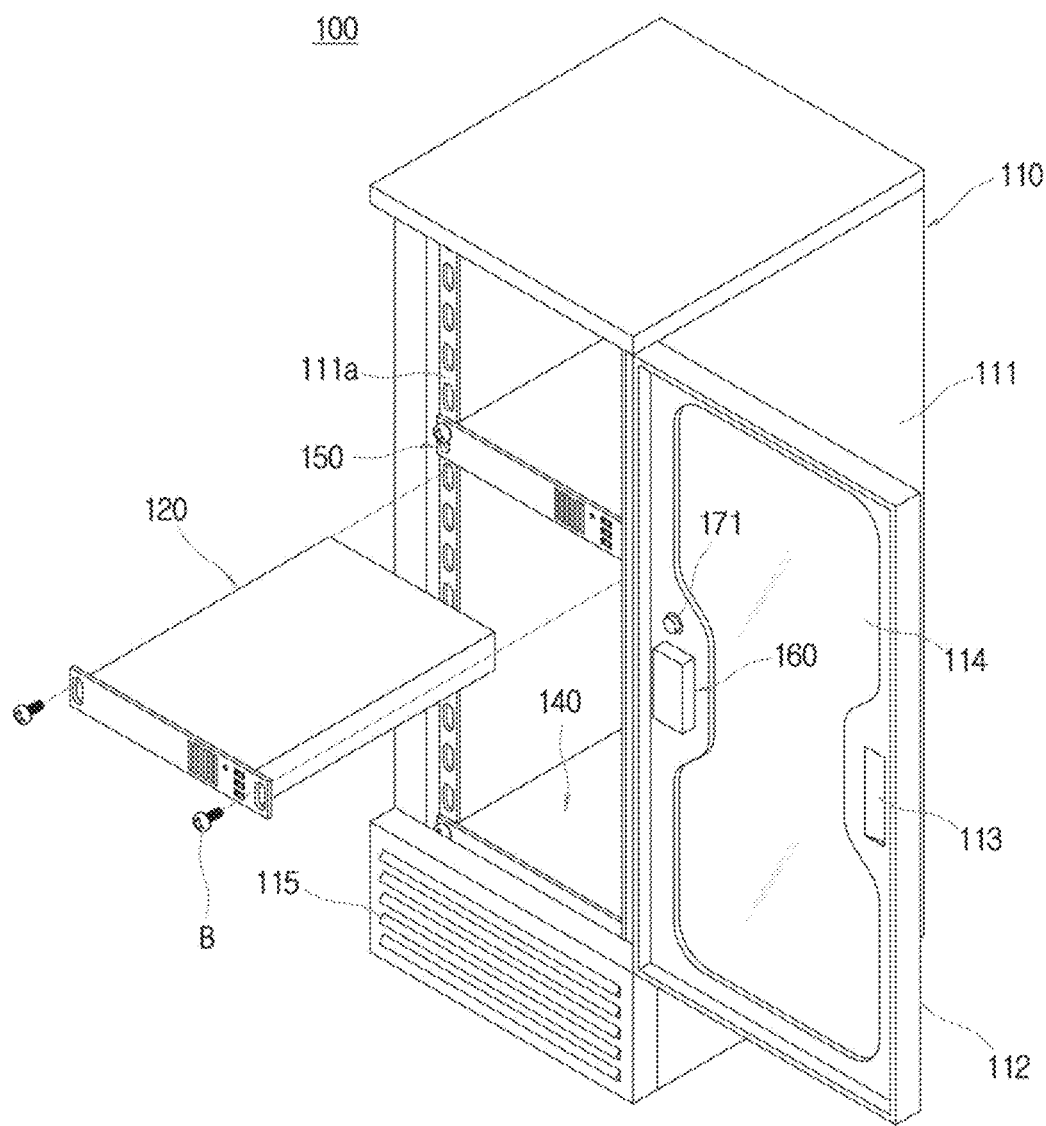
FIG. 3 is a perspective view schematically showing the server rack according to the present invention with the door thereof is opened and information processing devices separated therefrom.
Figure 4:
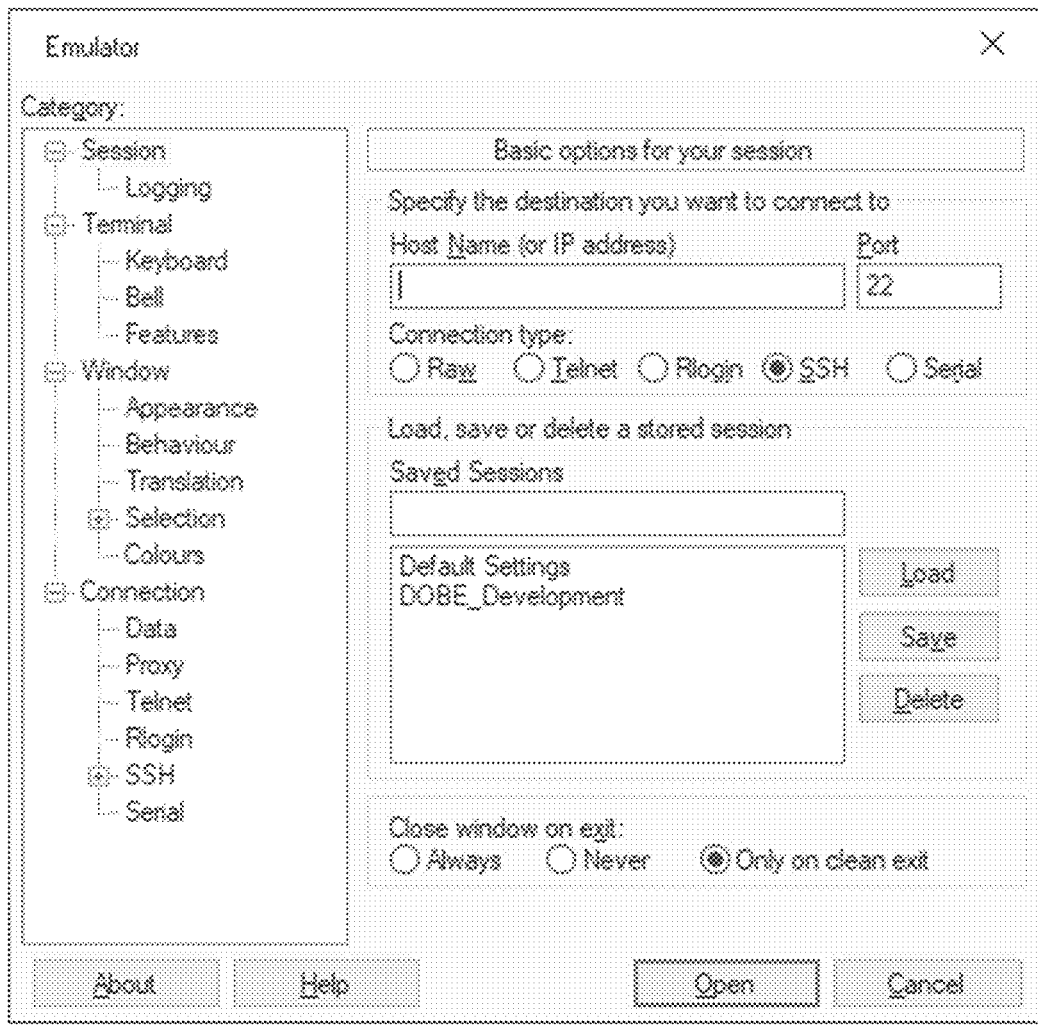
FIG. 4 is an image showing the execution window of an emulator that the microcomputer of the server rack according to the present invention outputs while communicating with an information processing device.

FIG. 1 is a block diagram showing an embodiment of the component devices of a server rack according to the present invention, FIG. 2 is a perspective view schematically showing the external appearance of the server rack according to the present invention, FIG. 3 is a perspective view schematically showing the server rack according to the present invention with the door thereof is opened and information processing devices separated therefrom, and FIG. 4 is an image showing the execution window of an emulator that the microcomputer of the server rack according to the present invention outputs while communicating with an information processing device.

Referring to FIGS. 1 to 4, a server rack 100 according to the present invention includes: a rack cabinet 110 equipped with a door 112; information processing devices 120, 120', and 120" (hereinafter referred to as "120") installed inside the rack cabinet 110 in accordance with rack mount specifications; collection devices 130, 130', and 130" (hereinafter referred to as "130") configured to collect environmental status information inside the rack cabinet 110; a temperature control device 140 configured to control an environmental status inside the rack cabinet 110; a network device 150 configured to establish a communication environment between the plurality of information processing devices 120; a microcomputer 160 configured to be connected to the network device 150 and exchange data with the information processing devices 120 through communication, to receive operating status information and environmental status information from the temperature control device 140 and the collection devices 130, and to control the operations of the information processing devices 120 and the temperature control device 140 according to input information; and an input/output device 170 configured to display content corresponding to the output information of the microcomputer 160 and to generate the input information according to the manipulation of an administrator.

The individual components of the configuration will be described in greater detail below. The rack cabinet 110 includes: a rack housing 111 configured to accommodate and install the information processing devices 120, the collection devices 130, the temperature control device 140, the network device 150, and the microcomputer 160; and the door 112 configured to selectively open and close the inside of the rack housing 111. The rack housing 111 is provided with a frame 111a configured to accommodate the information processing devices 120, the temperature control device 140, and the network device 150 for respective floors, and these devices are installed along the frame 111a. Meanwhile, the rack cabinet 110 is equipped with a power supply device 140', which is a power supply configured to drive the devices constituting the server rack 100. Meanwhile, the rack cabinet 110 is provided with the door 112 configured to be selectively opened and closed for the purpose of the stable operation of the devices, the maintenance of a low-temperature environment, and security. The door 112 can be opened and closed by an authorized administrator. Since the input/output device 170 is installed on the front side of the door 112, it is possible to intuitively check the environmental status of the rack cabinet 110 and the operating status of the internal devices, including the information processing devices 120, without opening the door 112. In the present embodiment, the door 112 of the rack cabinet 110 is provided with a transparent window 114 so that the administrator can visually check the internal space of the rack cabinet 110, and is provided with a grip 113 so that the administrator can open and close the door 112. The rack housing 111 is provided with vents 115 to maintain ventilation even when the door 112 is closed. Therefore, hot air is discharged from the temperature control device 140 through the vents 115, and cold air is also introduced through the vents 115.

Each of the information processing devices 120 is a computing device such as a server or a hub as described above. The plurality of information processing devices 120 is installed inside the rack cabinet 110, and processes data while operating independently. Therefore, the administrator needs to individually check the information processing devices 120 and perform management.

The collection devices 130 are a plurality of sensors configured to detect environmental conditions, i.e., humidity and temperature, inside the rack cabinet 110. The collection devices 130 are installed in various places inside the information processing devices 120, measure environmental conditions for respective sections, and transmit generated environmental status information to the microcomputer 160. In addition, at least one of the collection devices 130 may be measuring instrument configured to measure the power consumption of the power supply device 140'. The collection device 130 having a measurement function generates measured information such as environmental status information, and transmits it to the microcomputer 160.

The temperature control device 140 adjusts the environmental conditions inside the rack cabinet 110. The devices installed inside the rack cabinet 110 generate heat during operation and rapidly increase the temperature of the internal space closed by the door 112. This increase in temperature impedes the stable operation of the contained devices. In particular, in the case of the information processing devices 120 that are sensitive to signal processing, normal arithmetic processing is interrupted, thereby causing an error or stopping arithmetic operation. Therefore, the temperature control device 140 lowers the temperature inside the rack cabinet 110 so that the contained devices can maintain stable operation.

The network device 150 establishes a communication environment between the plurality of information processing devices 120. The microcomputer 160 and the information processing devices 120 communicate via a communication method, such as an SSH or Telnet connection, through the network device 150. Accordingly, the information processing devices 120 are capable of channel selection and communication process control through software communication connection rather than hardware communication connection. In addition, since each information processing device 120 is communicatively connected to a plurality of information processing devices 120 through the network device 150, the sizes of the information processing devices 120 can be reduced and the number of information processing devices 120 can be expanded.

The microcomputer 160 is connected to the network device 150, exchanges data with the information processing devices 120, receives operating status information and environmental status information from the temperature control device 140 and the collection devices 130, and controls the operations of the information processing devices 120 and the temperature control device 140 according to input information. The microcomputer 160 of the present embodiment can be installed on the inner surface of the door 112 or the rack housing 111 without the need to occupy a section in the rack cabinet 110 where the information processing devices 120 are installed. Meanwhile, in the microcomputer 160, an operating system (OS) configured to operate the microcomputer 160 is installed, and an emulator configured to operate based on the OS in order to perform compatible operation with the information processing devices 120. Since the information processing devices 120 process data while operating as independent operation systems, the emulator is installed such that the microcomputer 160 operates while being compatible with the plurality of information processing devices 120, so that the microcomputer 160 is connected with and operates in conjunction with the information processing devices 120 according to the communication system of the network device 150 shown in FIG. 4. Meanwhile, the microcomputer 160 is connected to the temperature control device 140 and the collection devices 130, receives operating status information from the temperature control device 140, and also receives environmental status information inside the rack cabinet 110 from the collection devices 130. The operating status information received from the temperature control device 140 relates to the operation of the temperature control device 140, and includes information about whether the temperature control device 140 is turned on/off, the temperature set in the temperature control device 140, and other information for the control of the temperature control device 140, and the environmental status information received from the collection devices 130 is the temperature and humidity of the rack cabinet 110, as described above. In addition, the microcomputer 160 controls the operations of the information processing device 120 and the temperature control device 140 according to input information received through the input/output device 170. The control of the information processing devices 120 may include the turning on/off of the information processing devices 120, the input and deletion of data, the installation of a program, etc., and the control of the temperature control device 140 may include the turning on/off of the temperature control device 140, the input of a set temperature, etc.

Meanwhile, the microcomputer 160 according to the present invention stores information, input/output through the emulator or the input/output device 170, in the log DB 161. To this end, when the microcomputer 160 accesses the information processing device 120 under the control of the administrator, a corresponding log module provided in the information processing device 120 accesses the input/output device 170, copies the input/output information output and generated through the input/output device 170, and stores it in the log DB 161. The input/output information stored in the log DB 161 is utilized as supplementary information for tracking back when an accident such as a failure of the information processing device 120 or a leak of important data occurs.

A detailed description of the operation process of the microcomputer 160 will be given below.

The input/output device 170 displays content corresponding to the output information of the microcomputer 160, and generates the input information according to the manipulation of the administrator. As described above, the input/output device 170 is installed on the front side of the door 112 like a conventional console, so that the administrator can intuitively check environmental conditions inside the rack cabinet 110 through corresponding content without opening the door 112. When necessary, the administrator may control the operations of the temperature control device 140 as well as the power supply device 140' and the information processing devices 120 by manipulating the input/output device 170. To this end, the input/output device 170 installed on the front side of the door 112 may be of a touch screen type, so that when the administrator operates a touch screen, corresponding input information is generated and transferred to the microcomputer 160. In addition, the input/output device 170 may be provided with an emergency button 171, so that in case of an emergency, the administrator can control the turning on/off of the temperature control device 140 by manipulating the emergency button 171.

Figure 5:
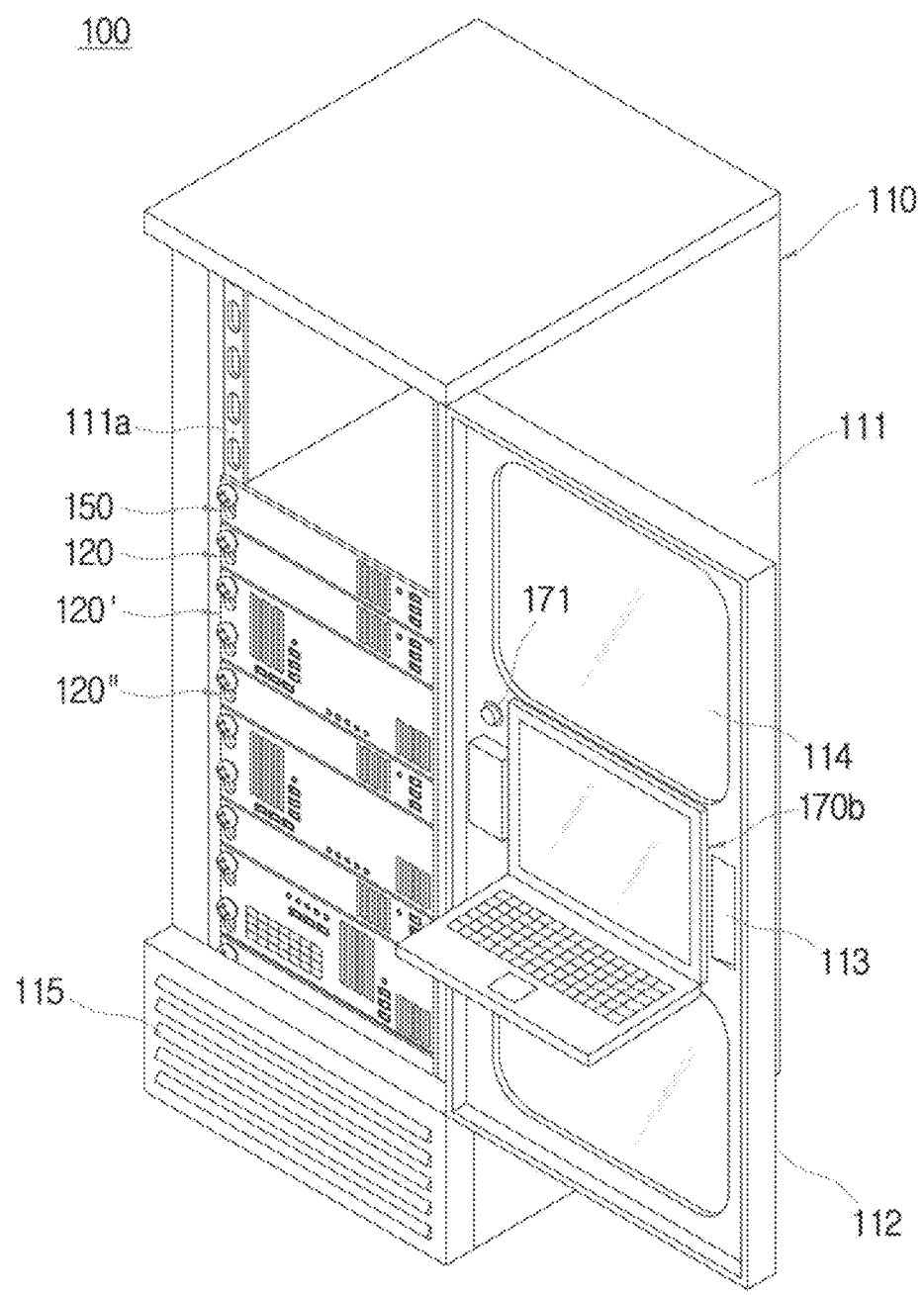
FIG. 5 is a perspective view showing an embodiment of an input/output device provided on a server rack according to the present invention.
Figure 6:
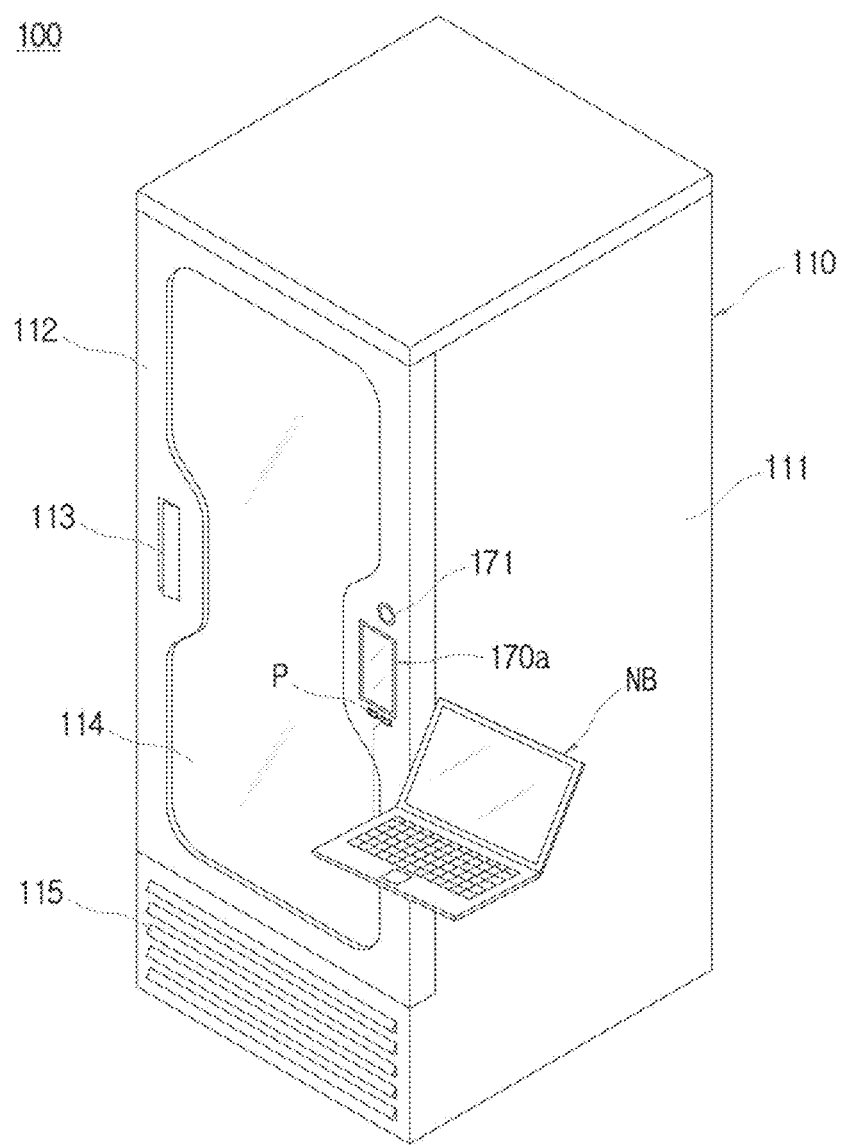
FIG. 6 is a perspective view showing another embodiment of an input/output device provided on a server rack according to the present invention.

FIG. 5 is a perspective view showing an embodiment of an input/output device provided on a server rack according to the present invention, and FIG. 6 is a perspective view showing another embodiment of an input/output device provided on a server rack according to the present invention.

Referring to FIGS. 1, 5 and 6, the input/output device 170 of the server rack 100 according to the present invention includes a first input/output device 170a installed on the front side of the door 112 in a touch screen manner and a second input/output device 170b foldably installed on the rear side of the door 112 while in contact with the inside of the rack cabinet 110. The first input/output device 170a is equipped with a monitor that can be checked by the administrator when the door 112 is closed. However, in the present embodiment, the monitor of the input/output device 170 has a relatively small size, so that there is a limitation in the type of content, and there is also a limitation in data output for the control of the information processing device 120. Accordingly, as shown in FIG. 5, the second input/output device 170b is equipped with a large monitor and equipment such as a keyboard configured to allow the administrator to input data.

Although the second input/output device 170b may be a conventional KVM switch, the second input/output device 170b according to the present invention is foldably installed on the rear surface of the door 112, so that the administrator can unfold the second input/output device 170b and then perform a task. Therefore, the second input/output device 170b is installed on the door 112 without occupying a section in which the information processing device 120 is installed in the rack cabinet 110, thereby increasing the space utilization of the rack cabinet 110.

Meanwhile, apart from the second input/output device 170b, the administrator may connect his/her laptop notebook NB to the microcomputer 160 by connecting the laptop notebook NB to a port P provided on the front side of the door 112. Accordingly, the administrator can control the information processing devices 120 from the outside without opening the door 112 and also control the operation of the temperature control device 140.

Figure 7:
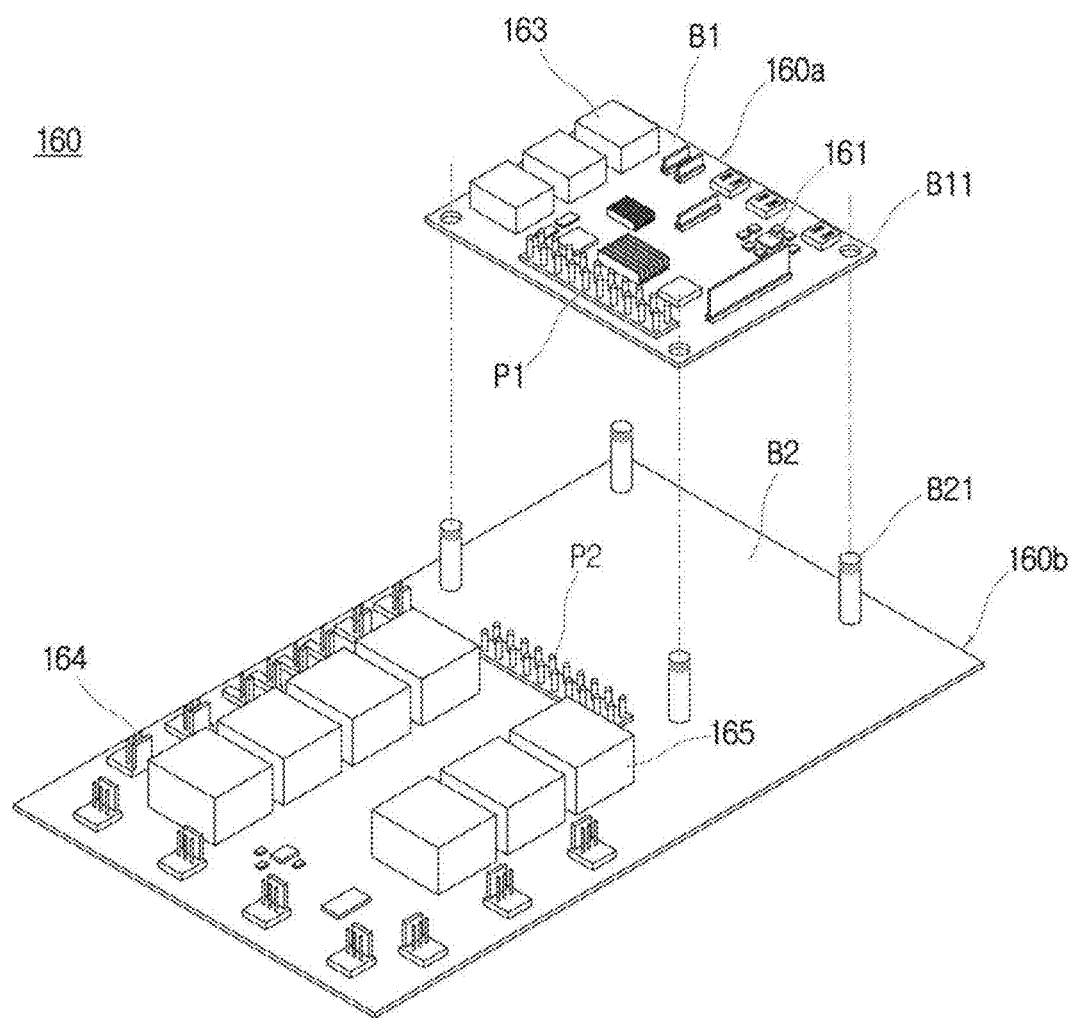
FIG. 7 is a perspective view showing the hardware of a microcomputer provided in a server rack according to the present invention.

FIG. 7 is a perspective view showing the hardware of a microcomputer provided in a server rack according to the present invention.

Referring to FIGS. 1 and 7, the microcomputer 160 according to the present invention includes: a main module 160a configured such that a CPU 161 configured to process processes according to the emulator and the OS (operating system), memory (not indicated) configured to store the processing target information of the CPU 161, and first connection terminals 163 configured to perform connection in order to enable data communication with the network device 150 and the input/output device 170 are mounted on a main board B1; and a sub-module 160b configured such that second connection terminals 164 configured to perform connection in order to enable data communication with the collection devices 130 and a relay 165 configured to support time difference communication between the second connection terminals 164 are mounted on a sub-board B2, and communicatively connected to the main board B1 via a data cable (not shown).

As described above, since the microcomputer 160 is connected to the network device 150 and is also connected to the temperature control device 140, the power supply device 140', the plurality of collection devices 130, and the input/output device 170, elements configured to allow operation without data collision and ports configured to allow the connection of the devices need to be provided on the board of the microcomputer 160, in addition to the main elements configured to execute a program. Accordingly, the miniature computer 160 is not only limited in reduction in size, but also has a limitation in the position where it can be installed inside the rack cabinet 110. Accordingly, the microcomputer 160 according to the present invention is divided into: the main module 160a including the CPU 161 and the memory required for the execution of a main process and the first connection terminals 163 connected to enable data communication with the network device 150 and the input/output device 170; and the sub-module 160b including the second connection terminals 164 connected to enable data communication with the collection devices 130; thereby allowing the microcomputer 160 to be implemented in a small size. In other words, by separating the connections with the peripheral devices, provided in the server rack 100 according to the present invention, to the separate sub-board 160b, the main module 160a can be installed in the rack cabinet 110 without difficulty while maintaining a compact size. Furthermore, since the sub-module 160b is provided with the relay 165 configured to enable time difference communication between the plurality of collection devices 130 and mounted on the sub-board B2, stable data communication between the plurality of collection devices 130 and the microcomputer 160 can be maintained.

Meanwhile, the data cable configured to connect the main module 160a and the sub-module 160b to each other is connected to the ports P1 and P2 provided on the main board B1 and the sub-board B2, respectively. Accordingly, the collected information of the collection devices 130 received by the sub-module 160b is transferred to the main module 160a and output through the input/output device 170 according to a set program.

In the microcomputer 160 according to the present invention, fixing rods B21 are provided on the sub-board B2 of the sub-module 160b, and fitting holes B11 configured such that the fixing rods B21 are inserted thereinto are famed in the main board B1 of the main module 160a, so that the main module 160a and the sub-module 160b are integrated with each other while forming a stacked structure.

Figure 8:
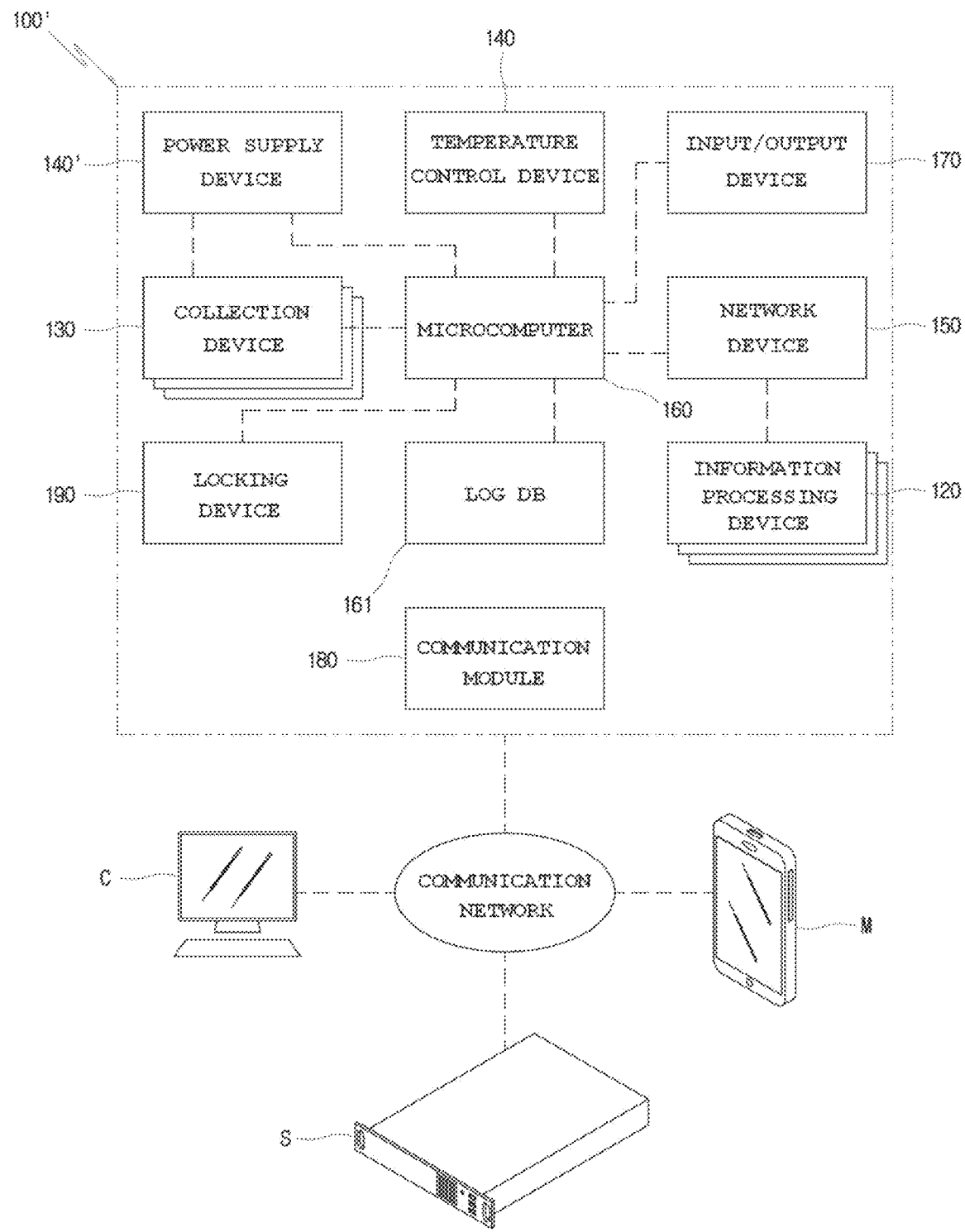
FIG. 8 is a block diagram showing another embodiment of the component devices of a server rack according to the present invention.

FIG. 8 is a block diagram showing another embodiment of the component devices of a server rack according to the present invention.

Referring to FIGS. 2, 3 and 8, the server rack 100' according to the present invention further includes a communication module 180 including a web browser and a communication device so that the network device 150 is connected to an external communication network such as the Internet. Accordingly, the server rack 100' exchanges designated data such as environmental status information and operating status information while communicating with the computer C of another administrator or a mobile device M as well as another server S. In the present embodiment, the other server S, the computer C, and the mobile device M are connected with the web browser of the server rack 100' and check environmental status information or operating status information, or the corresponding server rack 100' of the microcomputer 160 transmits environmental status information or operating status information.

Meanwhile, the microcomputer 160 of the server rack 100' according to the present invention performs the health check function (CPU usage rate, memory usage rate, etc.) of not only the information processing device 120 provided in the server rack 100' but also other peripheral devices (the temperature control device, the collection devices, the temperature control device, the power supply device, etc.) by using a Simple Network Management Protocol (SNMP) or the like, and stores the results of the performance in in log DB 161 so that they can be monitored by the administrator.

Furthermore, the microcomputer 160 transmits monitoring information, designated as meaningful data such as failure information, to a higher-level monitoring server (hereafter referred to as the "higher-level server") S or to the mobile device M of a person in charge in the form of an SMS, MMS or mail message or the like, so that the health check of the server rack 100' can be shared even via low network usage, thereby enabling an economical and systematic monitoring system to be constructed. The construction of such a monitoring system is enabled by applying the microcomputer 160 to the server rack 100'.

Furthermore, the microcomputer 160 allows only an authorized administrator to open the door 112. Accordingly, the door 112 is provided with a locking device 190 so that whether the door is locked is controlled by the microcomputer 160.

In order to verify the authentication of the administrator in the server rack 100', the administrator first registers personal information in the higher-level server S. Thereafter, the administrator accesses the server rack 100' and is connected with the microcomputer 160 using the mobile device M through short-range wireless communication such as Bluetooth or Wi-Fi. To this end, a dedicated application configured to perform communication with the microcomputer 160 and also perform verification authentication is installed in the mobile device M of the administrator. Thereafter, through the application, personal information, such as the name, phone number, etc. of the administrator, and a scheduled task are transferred to the microcomputer 160, and the microcomputer 160 checks whether personal information and a scheduled task have been registered by querying the higher-level server S for the personal information of the administrator. When the approval of the administrator for access is made by checking the corresponding registered information, the microcomputer 160 releases locking by controlling the locking device 190. Therefore, the administrator can open the door 112 and perform a task. When the task is completed, the microcomputer 160 or the mobile device M transmits not only a report on the task content but also the results of the task content, photos of a site, etc. to the higher-level server S by using the communication module 180 of the microcomputer 160 as a communication path. In addition, as described above, the microcomputer 160 transmits meaningful monitoring information selected from the environmental status information of the, server rack 100' and the operating status information of the information processing devices 120, to the higher-level server S through the communication module 180, and manages it.

The present invention is advantageous in that the convenience of management is increased because an administrator can easily manage the operations of the information processing devices and the storage environment inside the rack cabinet through one channel, the wiring structure of the server rack is simplified, the various types of functional scalability of the server rack is expected because a KVM switch can be replaced and, thus, the spatial utilization of the rack cabinet can be increased, and the management efficiency of the server rack is increased in conjunction with the outside because a network function capable of external communication is equipped.

In addition, the present invention is also advantageous in that the efficiency of the maintenance of the storage environment inside the rack cabinet is remarkably increased because it is possible to select a specific information processing device and collect information or to perform monitoring for management without opening and closing the door.

Although the present invention has been described with reference to the embodiments of the present invention in the detailed description of the present invention above, it will be apparent to those of ordinary skill in the art to which the present invention pertains that the present invention may be variously modified and changed without departing from the technical spirit and scope of the present invention set forth in the attached claims.

What is claimed is:

1. A server rack comprising:
   a rack cabinet equipped with a door;
   a plurality of information processing devices installed inside the rack cabinet in accordance with rack mount specifications;
   collection devices configured to collect environmental status information inside the rack cabinet;
   a temperature control device configured to control an environmental status inside the rack cabinet;
   a network device configured to establish a communication environment between the plurality of information processing devices;
   a microcomputer configured to be connected to the network device and exchange data with the information processing devices through communication, to receive operating status information and environmental status information from the temperature control device and the collection devices, and to control operations of the information processing devices and the temperature control device according to input information; and
   an input/output device configured to display content corresponding to output information of the microcomputer, and to generate the input information according to manipulation of an administrator;
   wherein the microcomputer includes an emulator in order to enable compatibility with the plurality of information processing devices;
   wherein the input/output device includes a first input/output device installed on a front side of the door in a touch screen manner and configured to receive and output environmental state information and operational states of the information processing devices from the temperature control device and the collection devices, and a second input/output device foldably installed on a rear side of the door while in contact with an inside of the rack cabinet and configured to generate input information for controlling the information processing devices; and
   wherein the microcomputer further includes a main module configured such that a central processing unit (CPU) for processing processes according to the emulator and an operating system (OS), memory for storing processing target information of the CPU, and first connection terminals for performing connection to enable data communication with the network device and the input/output device are mounted on a main board; a sub-module configured such that second connection terminals for performing connection to enable data communication with the collection devices and a relay for supporting time difference communication between the second connection terminals are mounted on a sub-board, and communicatively connected to the main board via a data cable; and fixing rods configured to couple the main board and the sub-board to each other so that the main module and the sub-module form a stacked structure.

2. The server rack of claim 1, further comprising:

a communication module configured to perform short-range wireless communication with a mobile device having approached the server rack, to receive administrator information, and to transmit the received administrator information to the microcomputer; and a locking device configured to selectively open and close the door;

wherein the microcomputer performs control to release the locking device when the administrator information transferred by the communication module is retrieved from registered information of a designated higher-level server or the microcomputer.

3. The server rack of claim 1, wherein the microcomputer stores information, input/output through an emulator or the input/output device, in a log DB.

4. The server rack of claim 1, further comprising a communication module configured to enable communication between the microcomputer and a higher-level server;

wherein the microcomputer exchanges the operating status information or environmental status information with the higher-level server through the communication module.

* * * * *